United States Patent [19]
Han

[11] Patent Number: 5,904,464
[45] Date of Patent: May 18, 1999

[54] AUTOMATIC COMPONENT ARRANGING APPARATUS

[75] Inventor: Young Ho Han, Ohsan-si, Rep. of Korea

[73] Assignee: LG Electronics Inc., Seoul, Rep. of Korea

[21] Appl. No.: 08/656,835

[22] Filed: Jun. 3, 1996

[51] Int. Cl.⁶ .................................................. B65G 59/08
[52] U.S. Cl. .................... 414/675; 414/795.4; 414/796.9
[58] Field of Search ............................. 414/795.4, 796.9, 414/403, 404, 413, 415, 675

[56] References Cited

U.S. PATENT DOCUMENTS

| | | | |
|---|---|---|---|
| 3,308,977 | 3/1967 | Cochran et al. | 414/404 |
| 4,599,026 | 7/1986 | Feiber et al. | 414/413 |

FOREIGN PATENT DOCUMENTS

| | | | |
|---|---|---|---|
| 60-197518 | 7/1985 | Japan | 414/413 |

*Primary Examiner*—Karen M. Young
*Assistant Examiner*—Gregory A. Morse

[57] ABSTRACT

An automatic component arranging apparatus is disclosed including a component containing unit for containing at least one type of component that is classified by type in at least one component box; a component supply unit for selectively drawing out the component box of the component containing unit, to thereby supply the component to another portion; a tray inducing unit for externally receiving an empty tray to thereby internally move it; and a component arranging unit for receiving the component supplied by the component supply unit, to thereby arrange it on the empty tray delivered by the tray inducing unit at a predetermined interval.

11 Claims, 12 Drawing Sheets

COMPONENT SUPPLY POSITION
COMPONENT COLLECTION POSITION

FIG. 11

AUTOMATIC COMPONENT ARRANGING APPARATUS

BACKGROUND OF THE INVENTION

The present invention relates to an automatic component arranging apparatus, and more particularly, to an automatic component arranging apparatus for automatically arranging components in a manner that is acceptable for supply to a component assembly system.

Description of Conventional Art

Figure 1:
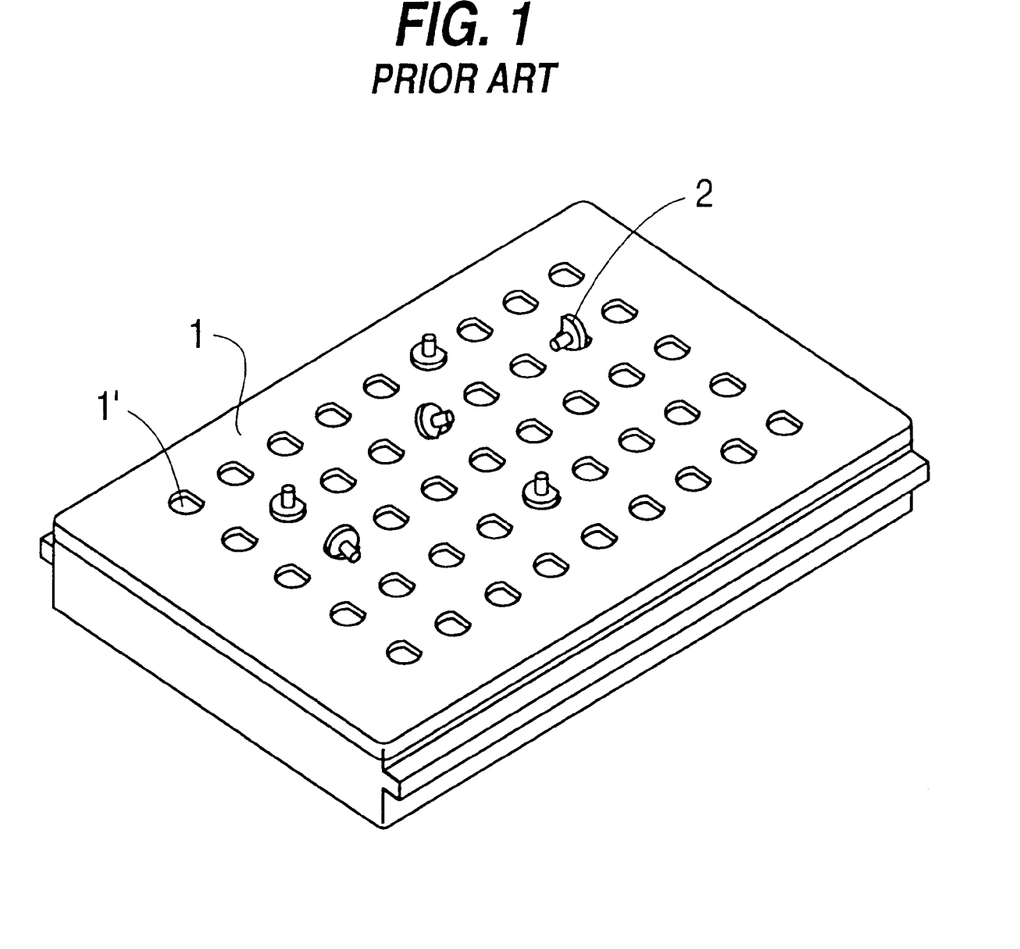
FIG. 1 is a perspective view of a conventional tray.

Generally speaking, a plurality of recesses 1' that are useful for mounting a predetermined portion of a component 2 are formed on a tray 1, as shown in FIG. 1. When tray 1 is shaken with component 2 supplied, the predetermined portion of component 2 is inserted into recess 1' so that components 2 are automatically arranged. A conventional automatic arranging apparatus will be discussed with reference to FIG. 2.

Figure 2:
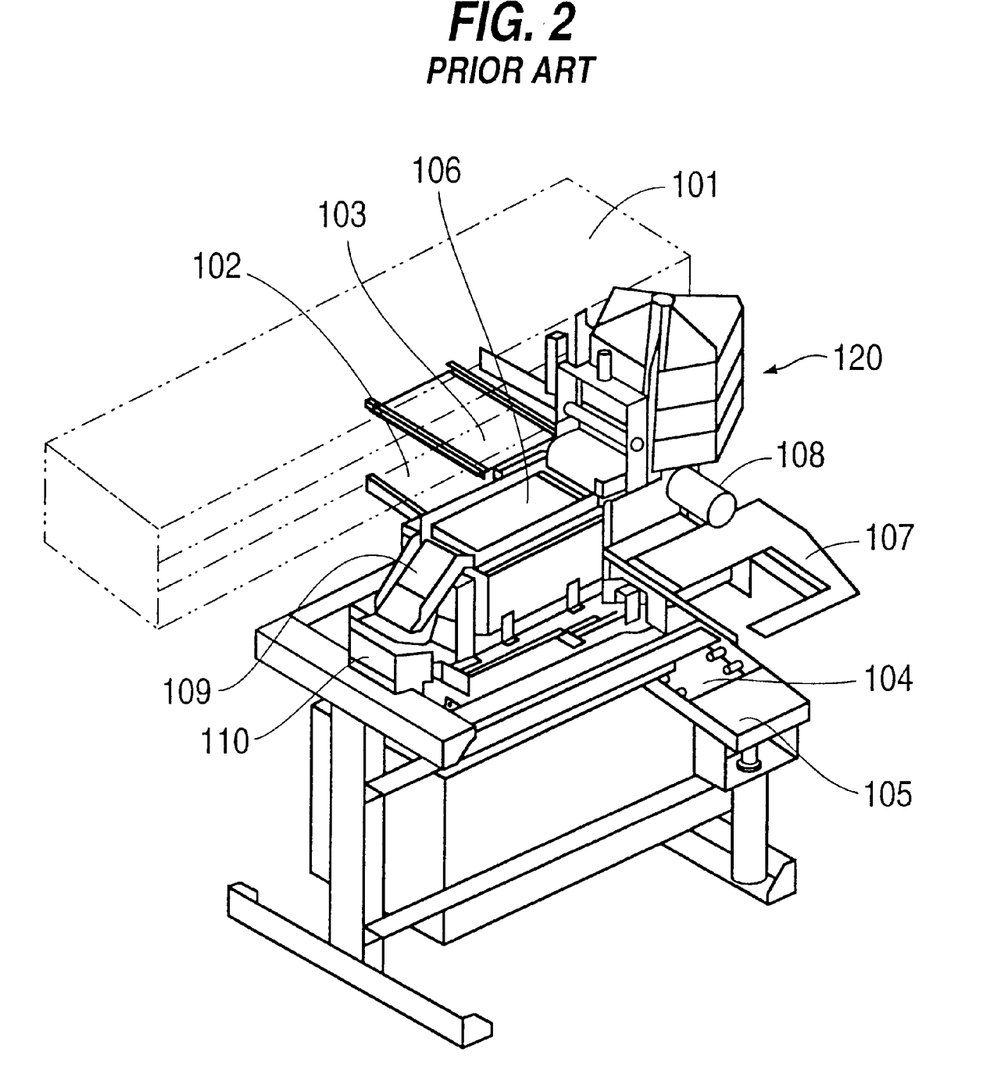
FIG. 2 is a perspective view of a conventional automatic component arranging apparatus.

A tray carrying conveyor 101 shifts empty tray 1 to the automatic component arranging apparatus. Empty tray 1 is introduced to a tray storage stand 104 by a first tray puller 102. Empty tray 1 on tray storage stand 104 is raised up to a shaking device by a second tray lift 105. The raised tray 1 is put on shaking device 106 by a second tray puller 107. A predetermined number of components are supplied from component supply 120. Shaking device 106 shakes tray 1 so that the supplied components 2 are arranged automatically. Tray 1, upon which components 2 are completely arranged, is moved onto first tray lift 103 by second tray puller 107. After this step, first tray lift 103 is lowered so that tray 1 is delivered to first tray puller 102. First tray puller 102 shifts tray 1 to tray carrying conveyor 101.

Residual components 2, which are not arranged during the component arrangement step, are collected into a component collecting box 110 while guided by a component collecting guide 109. The components collected into component collecting box 110 are re-supplied to component supply 120 through an additional procedure.

Figure 3A:
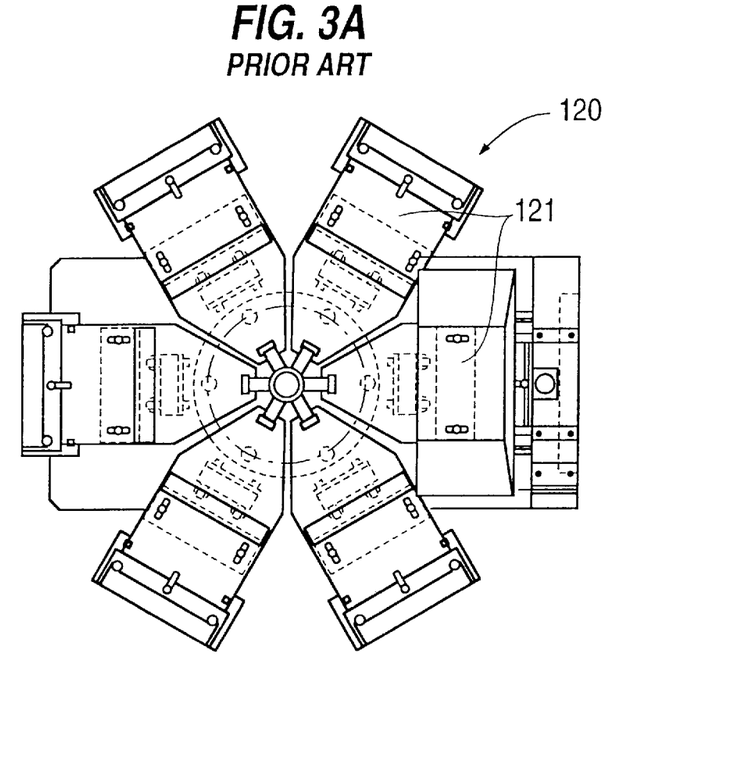
FIG. 3A is a plan view of a conventional component supply.
Figure 3B:
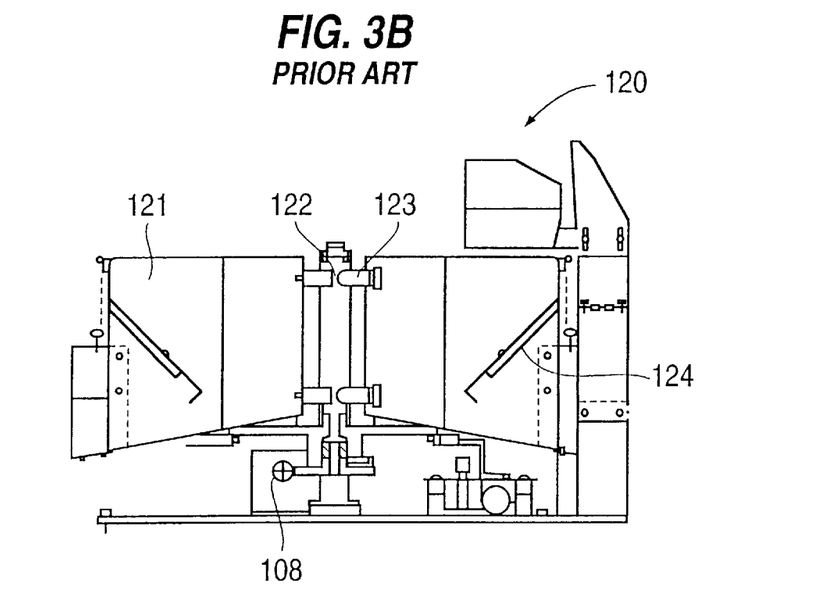
FIG. 3B is a plan view of the conventional component supply.

As shown in FIGS. 3A and 3B, component supply 120 is made up with six component boxes 121. These six component boxes 121 are disposed radially and fixed to a rotation shaft 122 by a fastening bolt 123. Each of component boxes 121 contains a gate 124 which becomes the path of components 2. Rotation shaft 122 is rotated by a rotation motor 108, and in turn component boxes 121 are rotated. The operation of component supply 120 will be described below.

When tray 1 is mounted on shaking device 106 by second tray puller 107, the tray type is discriminated Then, in order to make component box 121, coincide with vibration device 106, an additional controller rotates rotation motor 108 and component supply 120 at a predetermined angle. When component box 121 coincides with vibration device 106, a predetermined number of components that corresponds to the tray type are supplied to the empty tray from the component box 121. When components 2 of component box 121 are supplied to tray 1 mounted on vibration device 106, the components 2 is automatically arranged on tray 1. The conventional apparatus has six component boxes 121 so that a maximum of six components can be automatically arranged.

Figure 4:
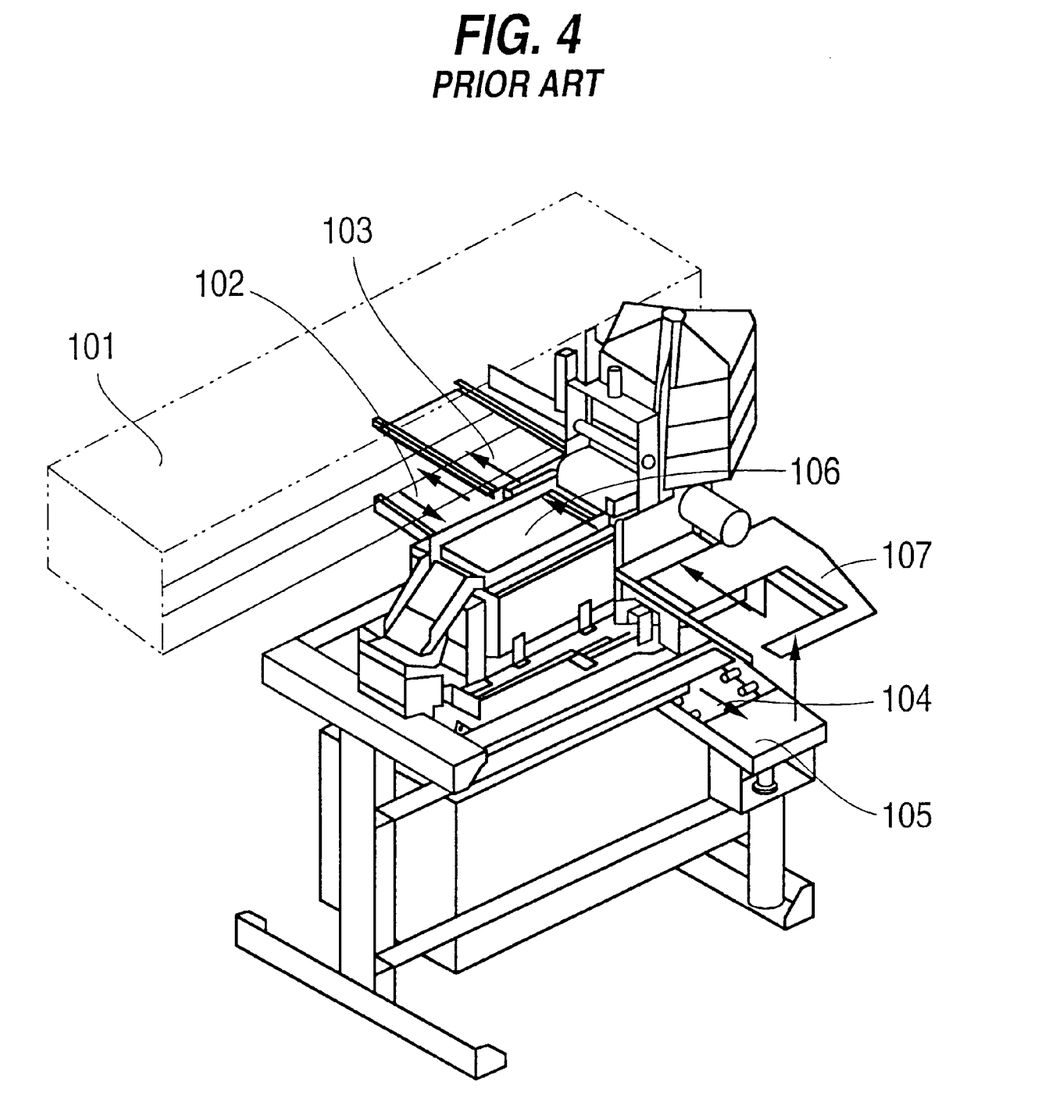
FIG. 4 shows the conveyance path of a tray in the conventional automatic component arranging apparatus.

In the conventional automatic component arranging apparatus constructed as described above, the tray path is shown by arrows in FIG. 4. Tray 1 is shifted to first tray puller 102 from tray carrying conveyor 101, and then raised by second tray lift 105 via tray storage stand 104. The raised tray 1 is put on vibration device 106 by second tray puller 107. Tray 1 receives components 2 from component supply 120 on vibration device 106, and is shifted to tray carrying conveyor 101 by second tray puller 107, first tray lift 103 and first tray puller 102.

Figure 5:
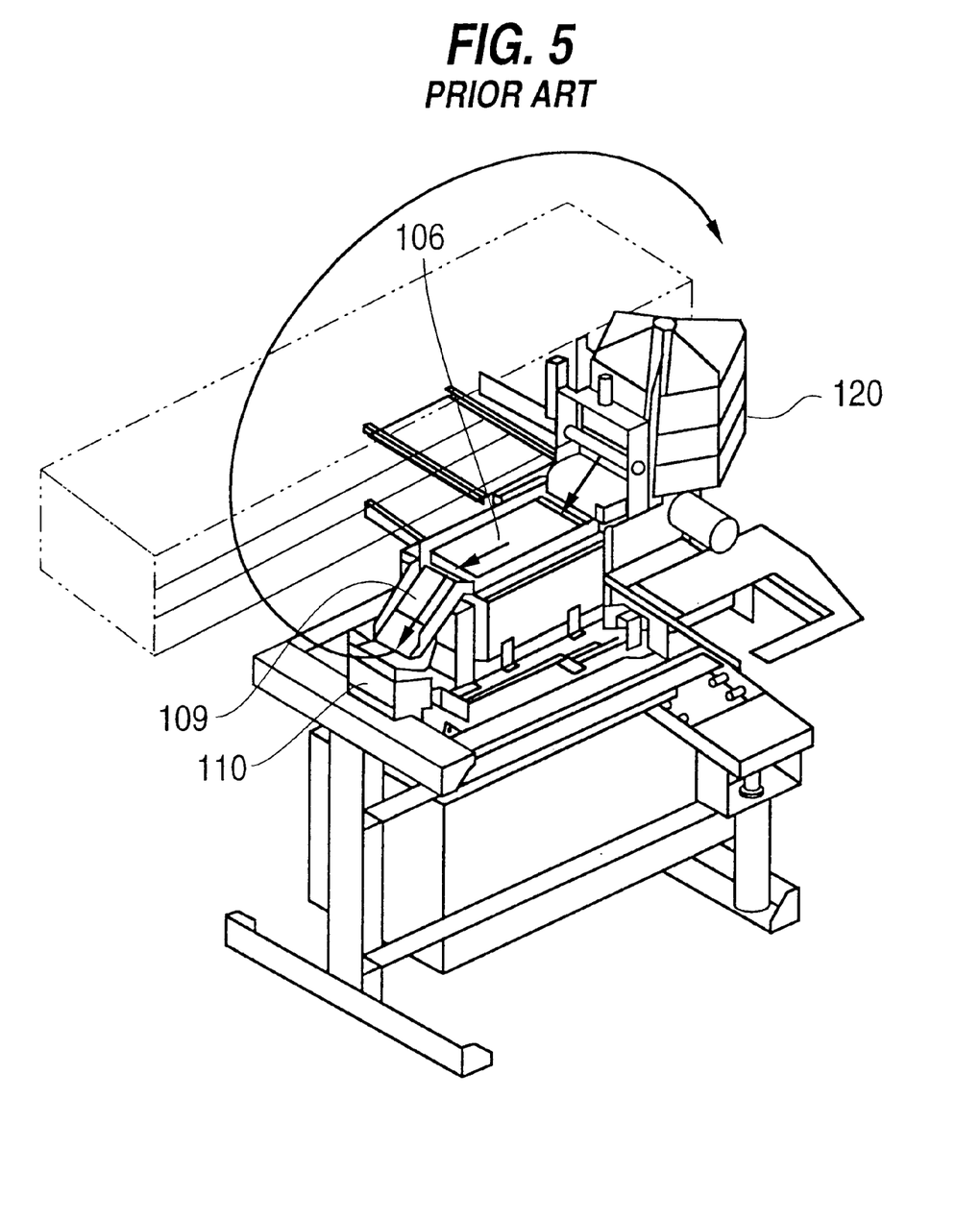
FIG. 5 shows the conveyance path of a component in the conventional automatic component arranging apparatus.

The component path of the conventional automatic component arranging apparatus of the present invention is shown by arrows in FIG. 5. Component 1 is supplied to tray 1 mounted on vibration device 106 from component box 121. Unarranged components 2 are collected into component collecting box 110 via component collecting guide 109, and then to component box 121 of component supply 120. The conventional automatic arranging apparatus of the present invention involves the following problems.

First, the number of different kinds of components is limited by the number of component boxes conventionally set to six, which is unsuitable for a production line system requiring many-kind-small-amount production. In order to compensate for this drawback, there has been suggested a method of sequentially stacking the six component boxes. However, this makes the apparatus larger and more complicated.

Secondly, it is hard to change the model of component. The conventional component box is fixed to a rotation shaft by a fastening bolt. Because of this, the component box cannot be changed directly with another component box having a different component. In order to change the components of the component box, the system must be changed into a manual mode, components must be collected into an additional component box, and new components must be placed into the fixed component box.

Thirdly, power is wasted because the whole component supply must be rotated in order to select one kind of component box. For more than six component boxes, power is consumed more.

Fourthly, different kinds of components are mixed. The components that are not arranged on the tray are contained in an additional component collecting box, and collected into the component box of the component supply where the same kind of components are contained. The component collecting box, having residual components, returns to its position under the component supply guide in order to collect remaining components in the next arrangement. However, previously collected components may remain in the returning component supply box, which components are mixed with the next collected components. This makes the process inefficient, and requires an additional classification step.

Fifthly, 24-hour automation (e.g., an unmanned system) is made impossible because many components cannot be supplied, and if so, the components are hard to change.

SUMMARY OF THE INVENTION

Therefore, it is an object of the present invention to provide an automatic component arranging apparatus for facilitating supply of components, facilitating changing the model of component, preventing power from being unnecessarily wasted, preventing the components from being mixed, and enabling 24-hour automation or unmanned system To accomplish the above and other objects of the present invention, there is provided an automatic component arranging apparatus comprising: a component containing unit for containing at least one kind of component classified by kinds in at least one component box; a component supply means for selectively drawing out the component box of the component containing unit, to thereby supply the component to another portion; a tray inducing unit for externally receiving an empty tray to thereby internally move it; and a component arranging unit for receiving the component supplied by the component supply unit, to thereby arrange it on the empty tray delivered by the tray inducing unit at a predetermined interval The component containing unit comprises: at least one row of vertical component box storage racks for receiving component boxes in layers; and a moving cylinder formed under the storage racks and for shifting them left or right.

The component supply unit comprises: a component box lift formed on one side of the storage racks lengthwise and for rising or falling along the row of the component box; a component box puller for drawing out the component box from the storage racks; and an angle giving cylinder for tilting the component box drawn out by the puller at a predetermined angle so as to discharge components.

The component supply unit further comprises a vibration giving motor for shaking a tilted component box.

The tray inducing unit comprises: a first carrying unit for inducing an empty tray into the apparatus from a conveyor belt; a tray storage stand placed higher than the component arranging unit and for temporarily storing the tray induced by the first carrying unit; a second carrying unit for lowering the empty tray of the tray storage stand to the height of the component arranging unit; and a third carrying unit for mounting the tray lowered by the second carrying unit onto the component arranging unit.

The first carrying unit comprises: a first tray puller for receiving the empty tray from the conveyor belt; and a first tray lift for receiving the empty tray from the first tray puller and raising it to the height of the tray storage stand.

The second carrying unit comprises: a second tray puller for drawing out the empty tray from the component storage stand; and a second tray lift for receiving the empty tray from the second tray puller and then lowering it to the height of the tray storage stand.

The third carrying unit comprises: a third tray puller for shifting the empty tray to the entrance of the component arranging apparatus; and a third cylinder for inserting the empty tray placed at the entrance into the component arranging unit. The tray inducing unit further comprises a tray discriminating sensor.

The component arranging unit comprises: a component supply guide for leading a component supplied by the component supply unit onto an empty tray; and a vibration device for shaking the tray where the components are supplied, so that they are arranged onto at least one hole formed on the tray. The component box is rectangle-shaped on one side of which a gate is formed to serve as a component supply path.

DETAILED DESCRIPTION OF PREFERRED EMBODIMENT

Hereinafter, a preferred embodiment of the present invention will be described with reference to the attached drawings.

Figure 6A:
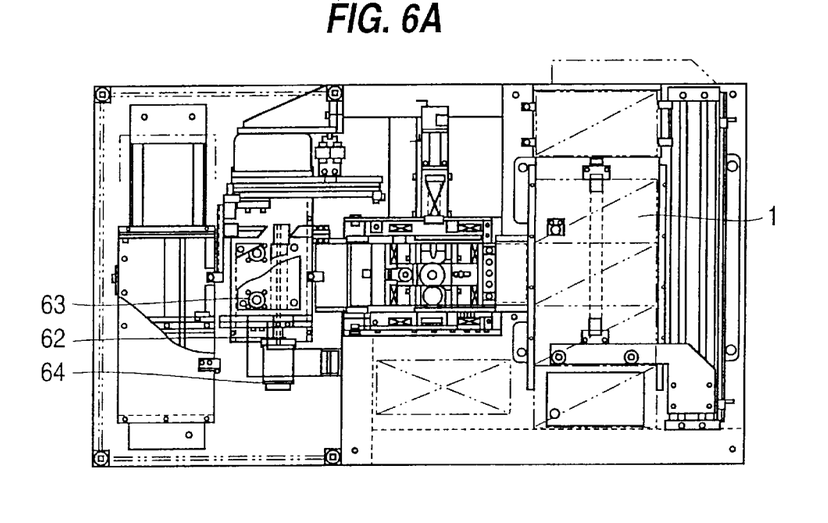
FIG. 6A is a plan view of one embodiment of an automatic component arranging apparatus of the present invention.
Figure 6B:
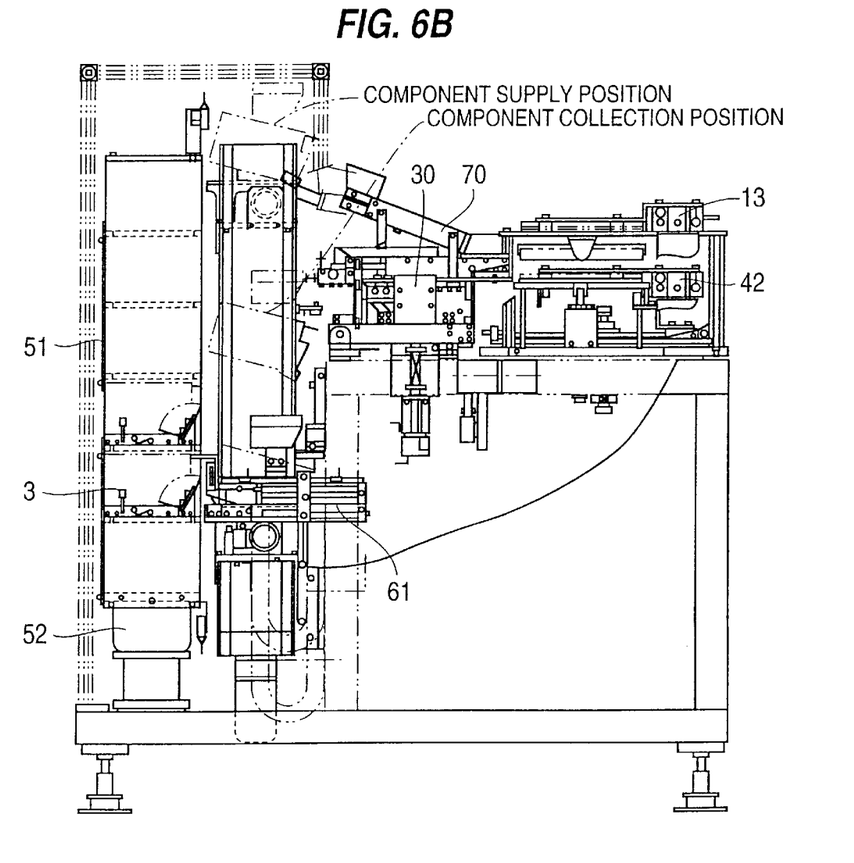
FIG. 6B is a front view of the automatic component arranging apparatus of the present invention.
Figure 6C:
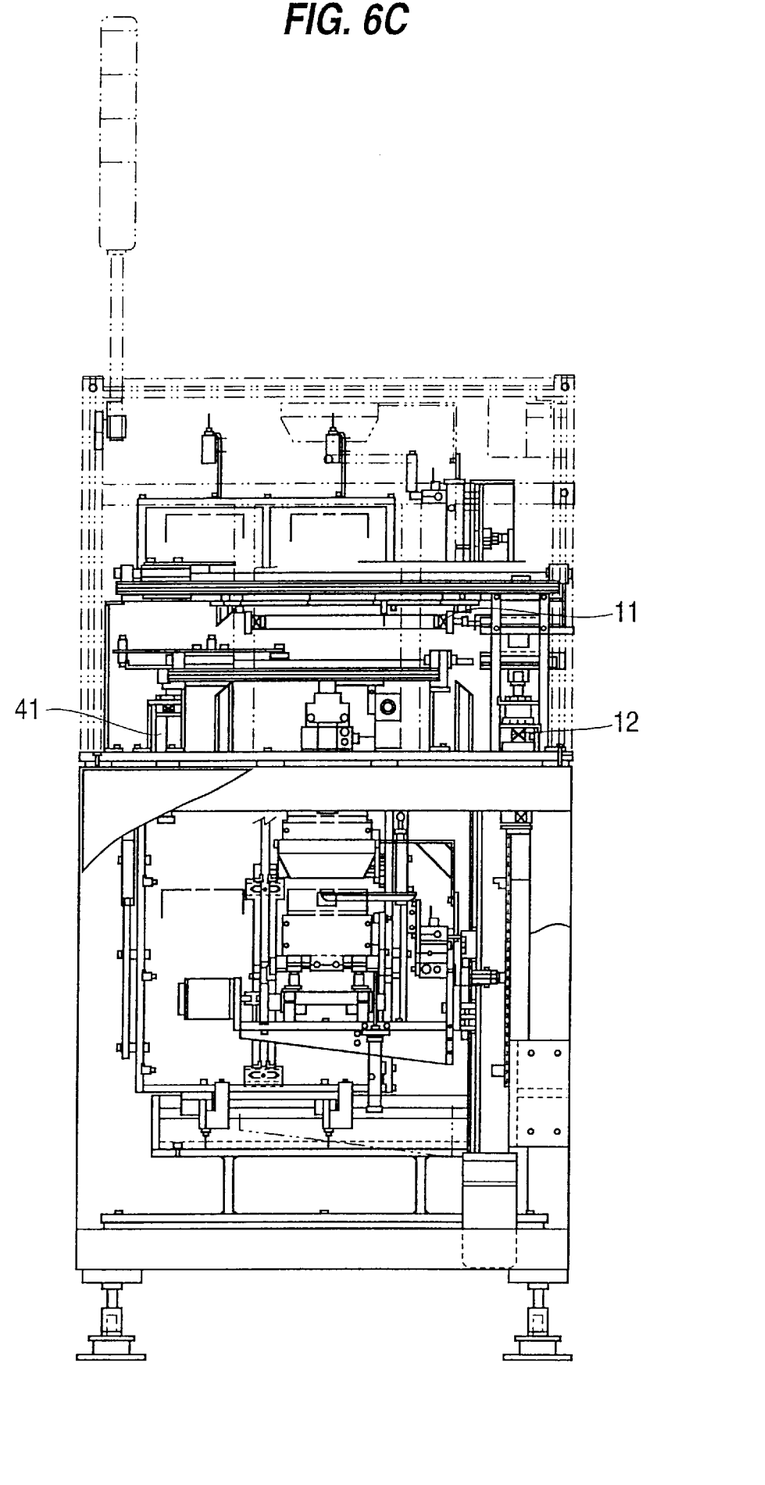
FIG. 6C is a side view of the automatic component arranging apparatus of the present invention.
Figure 7:
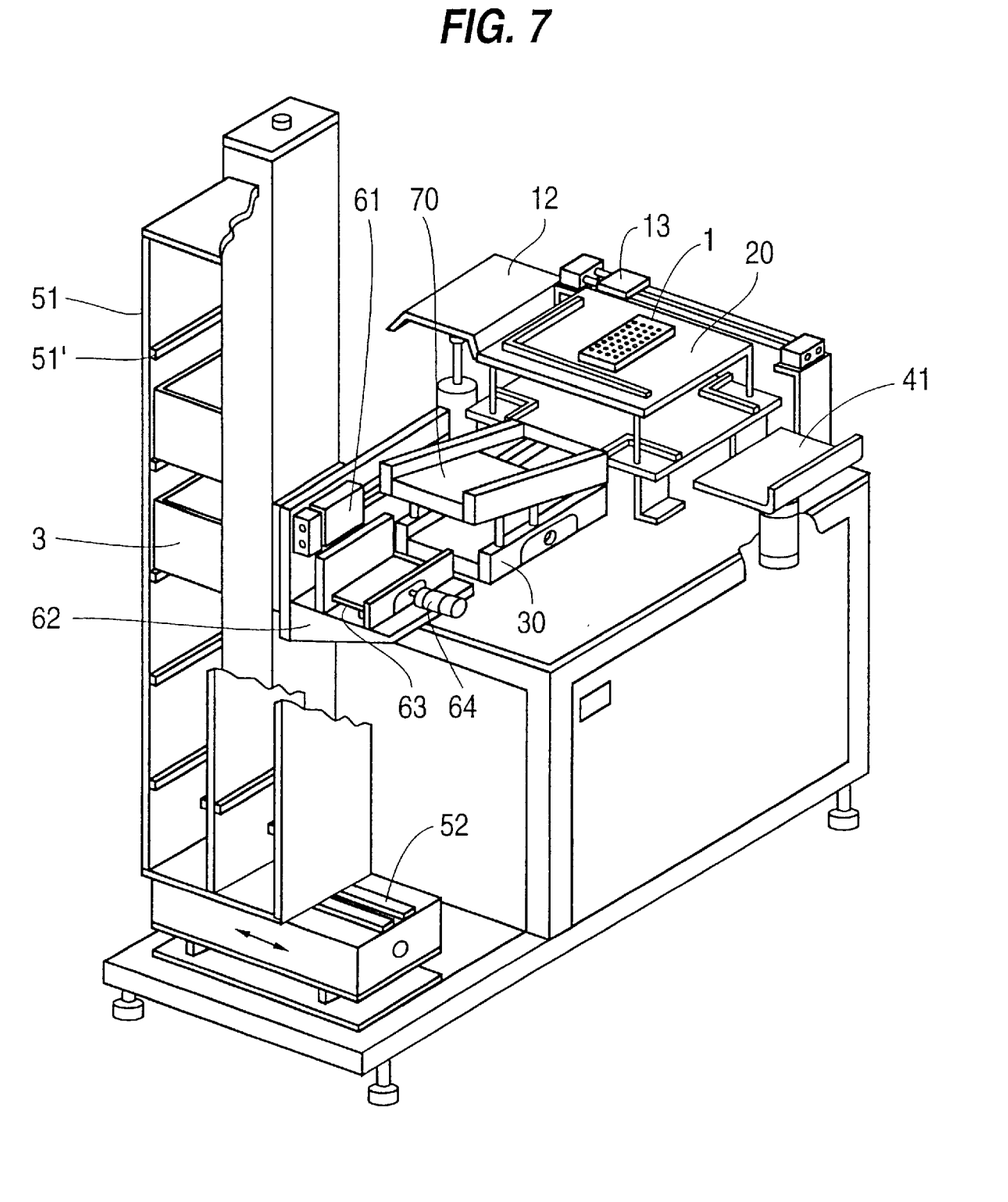
FIG. 7 is a perspective view of the automatic component arranging apparatus of the present invention.
Figure 8A:
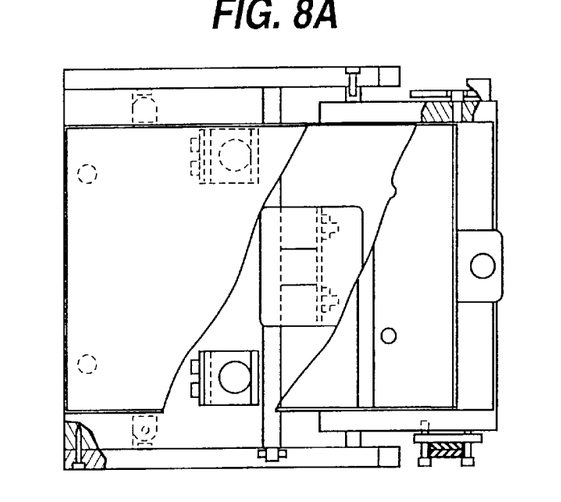
FIG. 8A is a plan view of one embodiment of the component box of the present invention.
Figure 8B:
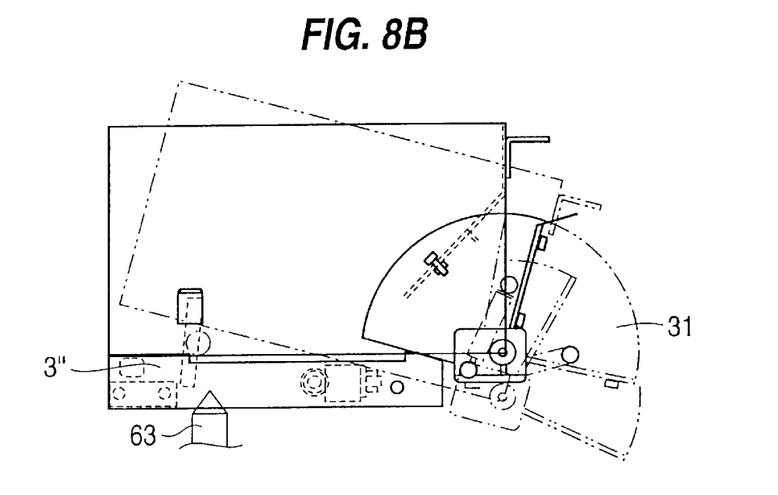
FIG. 8B is a front view of the component box of the present invention.
Figure 8C:
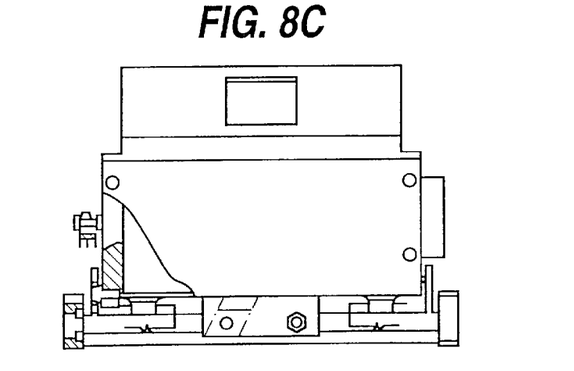
FIG. 8C is a side view of the component box of the present invention.
Figure 9:
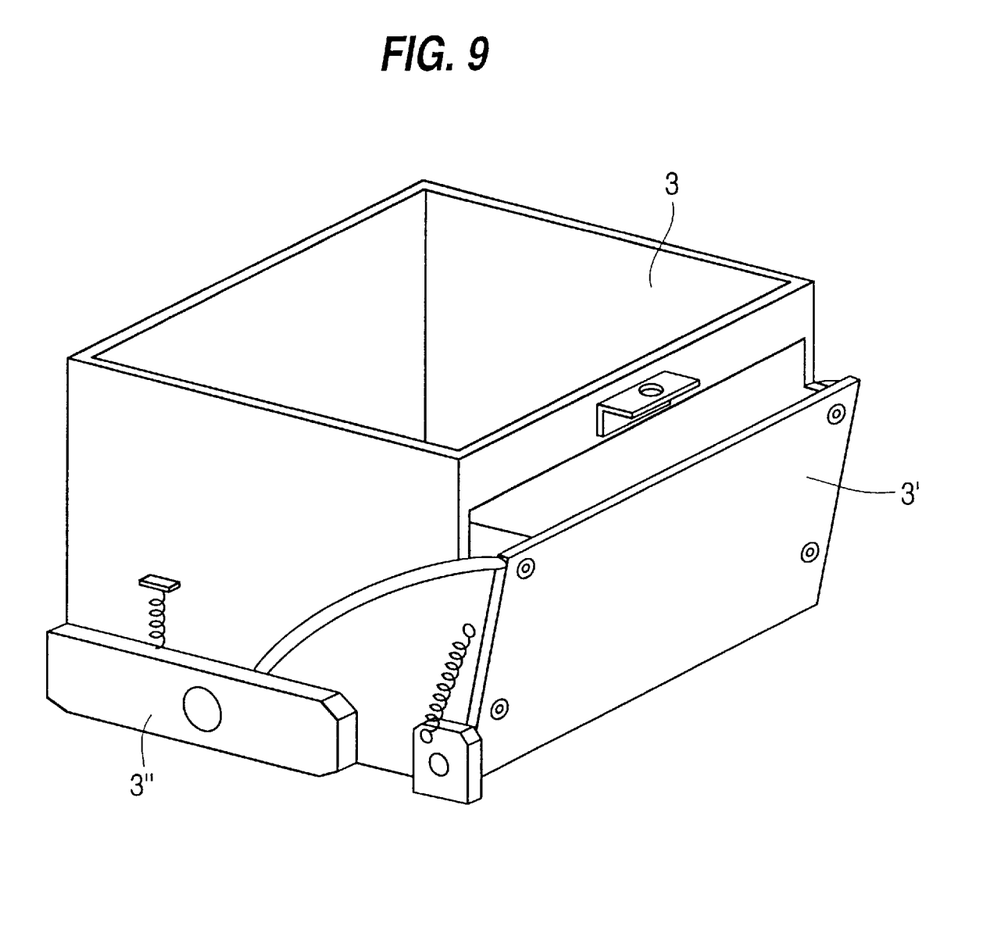
FIG. 9 is a perspective view of the component box of the present invention.

Referring to FIGS. 6A–7, a component containing unit comprises two rows of vertical component box storage racks 51 for receiving component boxes 3 in layers, and a storage rack carrying unit 52 formed under storage racks 51 and for moving storage racks 51 leftward or rightward. Guide rails 51' are formed on storage racks 51 to lead guide rails 3" (see FIGS. 8B and 9) of component box 3. Storage racks 51 are matrix-structured, and expandable up to ten rows or more.

A component supply unit comprises a component box lift 62 formed lengthwise on one side of storage racks 51 and for rising or falling along the row of component box 3, a component box puller 61 for drawing out component boxes 3 from storage racks 51 and for inserting them into lift 62, an angle giving cylinder 63 for tilting component box 3 drawn out by puller 61 at a predetermined angle so as to discharge components, and a vibration giving motor 64 for shaking the tilted component box 3. Component box 3, mounted on lift 62, discharges a predetermined number of components at a position where the components are to be supplied, and then collects residual unarranged components at a position where they are to be collected.

A tray inducing unit comprises a first tray puller (not shown) for receiving empty tray 1 from a conveyor belt, a first tray lift 12 for receiving empty tray 1 from the first tray puller and raising it, a tray storage stand 20 formed at the height of the raised first tray lift 12 and for temporarily storing the tray raised by first tray lift 12, a second tray puller 13 for carrying empty tray 1 of first tray lift 12 via component storage stand 20, a second tray lift 41 for receiving empty tray 1 from second tray puller 13 and then lowering it to the height of the component arranging unit, a third tray puller 42 for shifting the lowered empty tray 1 to the entrance of vibration device 30, and a third cylinder (not shown) for inserting the empty tray placed at the entrance into the component arranging unit. The kind of empty tray 1 placed at the entrance of the component arranging unit by third tray puller 42 is discriminated by a tray discriminating sensor.

A component arranging unit comprises a component supply guide 70 for leading the component supplied by component box 3 at the component supply position onto empty tray 1, and a vibration device 30 for shaking the tray where the components are supplied, so that they are arranged onto at least one hole formed on the tray. Component box 3 is rectangle-shaped on one side of which a gate 3' is formed to serve as a component supply path.

The operation of the present invention will be described hereinafter.

When tray 1 where components 2 are not arranged is shifted from tray carrying conveyor 101 to the automatic component arranging apparatus by the first tray puller, first tray lift 12 raises tray 1 up to tray storage stand 20. The raised tray is moved to second tray lift 41 by second tray puller 13 via tray storage stand 20, and is lowered by second tray lift 41.

The lowered tray 1 moves by third tray puller 42 until it reaches vibration device 30, where the tray 1 type is discriminated. When the tray 1 type is discriminated, component box lift 62 moves to a position where component box 3 is placed corresponding to discriminated tray 1. Component box puller 61 mounts component box 3 on component box lift 62. Component box lift 62, where component box 3 is mounted, moves to the component supply position.

When tray 1 is supplied to vibration device 30 by the third cylinder, components 2 of component box 3 are supplied to tray 1 by component supply guide 70. Components 2 supplied are automatically arranged on tray 1 due to vibration. While the components are arranged on the tray, component box 3 placed at the component supply position is shifted to the component collecting position by component box lift 62. Unarranged components 2 are collected into component box 3 at the component collecting position.

Tray 1, upon which components 2 are completely arranged, moves to first tray lift 12 by third tray puller 42. When first tray lift 12 is lowered and reaches first tray puller 11, first tray puller 11 supplies tray 1 to conveyor belt 101.

If there is a modification of the model in the component assembly system, component box storage rack 51 is shifted by a storage rack carrying unit 52, if necessary, and component box storage rack 51 so that components 2 of the modified model are automatically selected.

Figure 10:
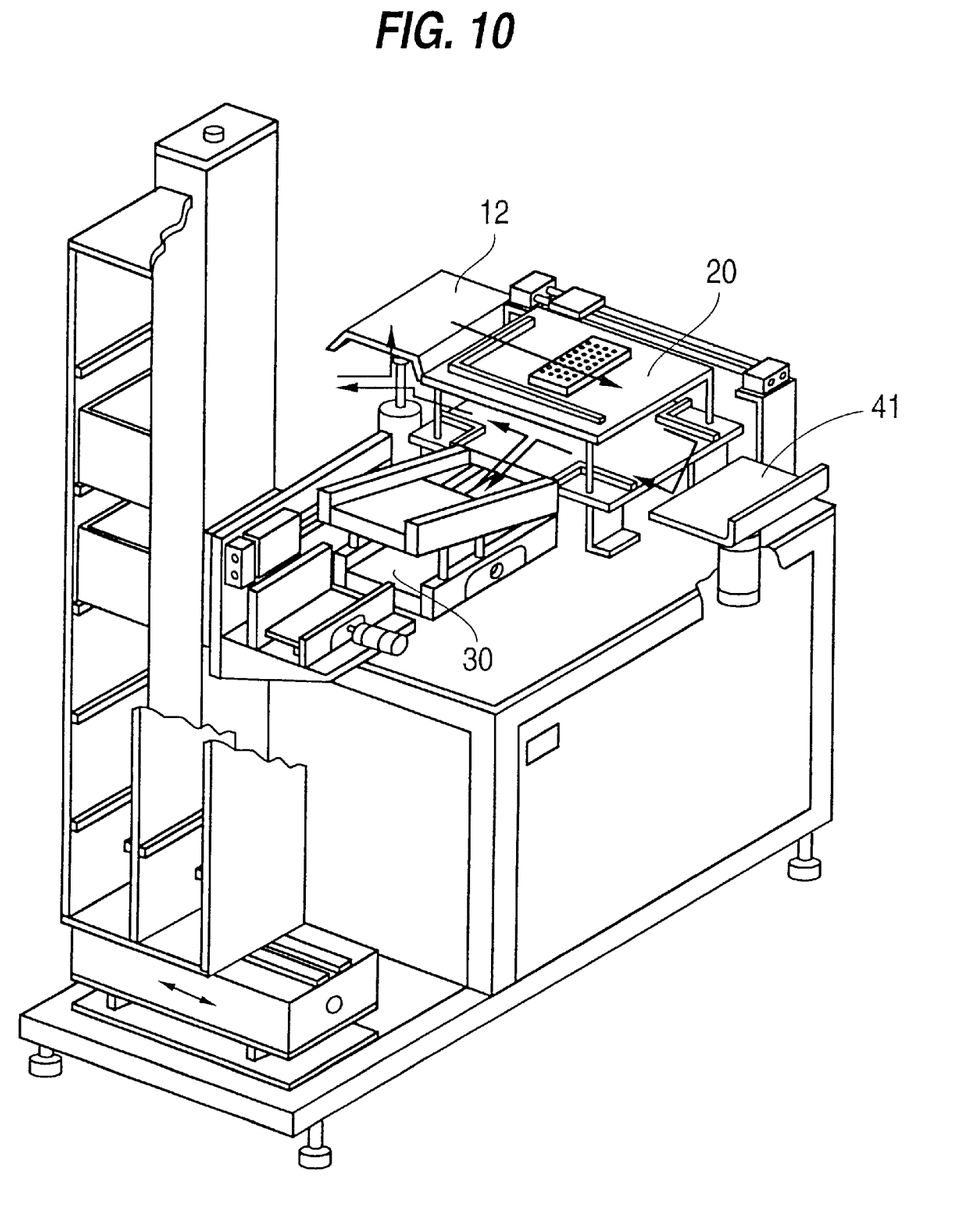
FIG. 10 shows the conveyance path of a tray in the automatic component arranging apparatus of the present invention.

The tray path of the automatic component arranging apparatus of the present invention is from tray carrying conveyor 101, to the first tray puller (not shown), first tray lift 12, second tray puller 13, tray storage stand 20, second tray puller 13, second tray lift 41, third tray puller 42, vibration device 30, third tray puller 42, first tray lift 12, first tray puller 11, and tray carrying conveyor 101, as shown in FIG. 10.

Figure 11:
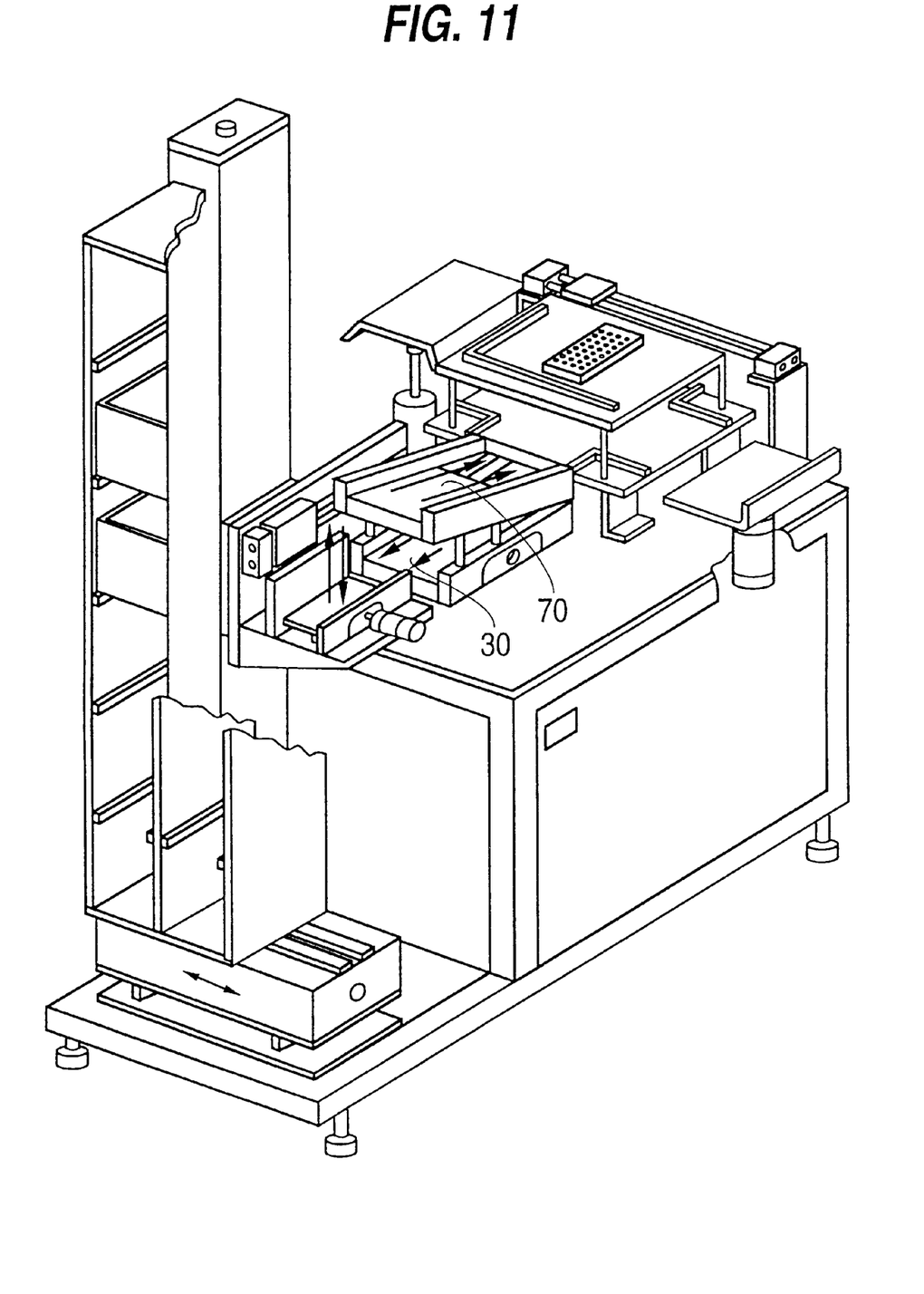
FIG. 11 shows the conveyance path of a component in the automatic component arranging apparatus of the present invention.

The component path of the automatic component arranging apparatus of the present invention starts from component box 3 where the components are supplied at the component supply position, to component supply guide 70, vibration device 30, and then component box 3 placed at the component collecting position.

The present invention has the following effects.

First, many different kinds of components may be incorporated into the production line using the present invention. Specifically, in the present invention, the component box storage rack is matrix-structured. According to the number of the component boxes, the row or column of the matrix is increased. This matrix is shifted left or right by the storage rack moving cylinder. By expanding the matrix structure, many different kinds of component can be supplied.

Secondly, it is easy to change the model of component because the component box of the present invention is detachably or attachably mounted on the component box storage rack.

Thirdly, the waste of power is prevented because only the lift is raised or lowered in order to select one kind of component box. There is no need to shift the whole component supply.

Fourthly, different kinds of component are not mixed because components not arranged on the tray are collected into the same component box at the component collecting position.

Fifthly, 24-hour automation or unmanned system is made possible because the component box can be supplied automatically to the component box storage rack by an AGV.

Sixthly, more components can be mounted in the same volume than in the conventional component box.

Although the present invention has been described above with reference to the preferred embodiments thereof, those skilled in the art will readily appreciate that various modifications and substitutions can be made thereto without departing from the spirit and scope of the invention as set forth in the appended claims.

What is claimed is:

1. An automatic component arranging apparatus comprising:

component containing means for containing plural stacked component boxes, each of the component boxes having components of a single type;

component supplying means for selecting a component box from among the plural component boxes, and for removing at least one component from within the selected component box;

tray receiving means for receiving a tray from an external source; and component arranging means for receiving the at least one component supplied by the component supplying means from within the selected component box, and for arranging the component received on the tray received by the tray receiving means.

2. The automatic component arranging apparatus recited by claim 1, wherein the component containing means comprises:

at least one row of vertical storage racks holding the plural component boxes in layers; and a storage rack carrying unit positioned under the storage racks for shifting the storage racks laterally.

3. The automatic component arranging apparatus recited by claim 2, wherein the component supply means comprises:

a component box lift positioned on one side of the component containing means and moving vertically along the stack of component boxes;

a component box remover for removing the selected component box from the storage racks; and a cylinder for tilting the selected and removed component box at a predetermined angle to discharge components from within the selected component box.

4. The automatic component arranging apparatus recited by claim 3, wherein the component supply means further comprises:

a vibration giving motor for shaking the component box that has been tilted by the cylinder.

5. The automatic component arranging apparatus recited by claim 1, wherein the tray receiving means comprises:

first carrying means for receiving the tray from a conveyor belt and moving the tray to a predetermined position;

a tray storage stand positioned higher than the component arranging means for temporarily storing the tray received by the first carrying means at the predetermined position;

second carrying means for lowering the tray temporarily stored by the tray storage stand to a height of the component arranging means; and third carrying means for mounting the tray onto the component arranging means after the tray has been lowered by the second carrying means.

6. The automatic component arranging apparatus recited by claim 5, wherein the first carrying means comprise:

a first tray puller for receiving the tray from the conveyor belt; and a first tray lift for receiving the tray from the first tray puller and for raising the tray to the predetermined position which corresponds to a height of the tray storage stand in which the tray is temporarily stored.

7. The automatic component arranging apparatus recited by claim 5, wherein the second carrying means comprises:

a second tray puller for removing the tray from the component storage stand; and a second tray lift for receiving the tray from said second tray puller and for lowering the tray to a height of the tray storage stand.

8. The automatic component arranging apparatus recited by claim 5, wherein the third carrying means comprises:

a third tray puller for shifting the tray to the entrance of the component arranging apparatus; and a third cylinder for inserting the tray placed at the entrance into the component arranging means.

9. The automatic component arranging apparatus recited by claim 5, wherein the tray receiving means further comprises a tray discriminating sensor.

10. The automatic component arranging apparatus recited by claim 1, wherein the component arranging means comprises:

a component supply guide for leading the at least one component supplied by said component supply means onto a tray; and a vibration device for shaking the tray upon which at least one component is supplied such that at least one of the components is engaged with a hole formed on the tray.

11. The automatic component arranging apparatus recited by claim 1, wherein the component box is rectangle-shaped, a gate being positioned on one side of the component box to serve as a component supply path.

* * * * *